(12) United States Patent
Barber et al.

(10) Patent No.: US 8,685,633 B2
(45) Date of Patent: Apr. 1, 2014

(54) METHOD FOR OPTIMIZING WAFER EDGE PATTERNING

(75) Inventors: Duane B. Barber, Portland, OR (US); David J. Sturtevant, Gresham, OR (US)

(73) Assignee: LSI Corporation, San Jose, CA (US)

( * ) Notice: Subject to any disclaimer, the term of this patent is extended or adjusted under 35 U.S.C. 154(b) by 1050 days.

(21) Appl. No.: 10/929,706

(22) Filed: Aug. 30, 2004

(65) Prior Publication Data

US 2006/0046213 A1 Mar. 2, 2006

(51) Int. Cl.
*G03F 1/00* (2012.01)

(52) U.S. Cl.
USPC ................ 430/396; 430/5; 430/22; 430/311; 430/312; 430/394

(58) Field of Classification Search
USPC ................ 430/5, 396, 394, 311, 312, 22
See application file for complete search history.

(56) References Cited

U.S. PATENT DOCUMENTS

| | | | | |
|---|---|---|---|---|
| 4,115,002 A | * | 9/1978 | Clark | 355/54 |
| 5,398,309 A | * | 3/1995 | Atkins et al. | 345/634 |
| 6,238,850 B1 | * | 5/2001 | Bula et al. | 430/394 |
| 2001/0003033 A1 | * | 6/2001 | Schulze et al. | 430/311 |
| 2006/0093965 A1 | * | 5/2006 | Sturtevant et al. | 430/313 |

* cited by examiner

*Primary Examiner* — Thorl Chea
(74) *Attorney, Agent, or Firm* — Clark Hill PLC

(57) ABSTRACT

A method of printing an image on a wafer. The method includes the steps of printing a main image, wherein the main image includes fields which are fully on the wafer, and printing an alternate image, wherein the alternate image includes fields which are only partially on the wafer. The alternate image could be placed on a separate mask which is loaded onto the exposure tool after the mask with the main image has completed printing. Alternatively, it could be an extra image specially inserted on the mask with the main image for that layer.

1 Claim, 2 Drawing Sheets

METHOD FOR OPTIMIZING WAFER EDGE PATTERNING

BACKGROUND

The present invention generally relates to photolithography, and more specifically relates to a method for optimizing wafer edge patterning.

The present invention deals with the need to maintain wafer flatness at the edge of the wafer so as to accurately print images in focus at the edge of a wafer so that edge die will yield. In particular, the present invention deals with the need to accomplish this while using masks with small-field patterns. In some schemes, this is key to optimizing yield.

Existing approaches to solving this problem include attempting to prevent edge topography by tightly controlling CMP performance at the wafer edge. Unfortunately, there are limits on how much performance can be extracted from a CMP process. Furthermore, optimizing CMP wafer edge topography sufficiently to improve edge die imaging fidelity may well have adverse impacts on other CMP parameters, such as within-die uniformity.

Another approach involves exposing edge images with focus tilts so as to try to pre-compensate for wafer edge topography, thereby reducing defocus effects. However, attempting to pre-compensate for edge tilts is speculative at best. Wafer edge topography tends to be random in nature, both in terms of its occurrence, its location, and its severity. Any tilts introduced may improve some edge dies, but will very likely make others worse.

Yet another approach involves exposing the current image in "dummy shots" adjacent to, but exterior to, the edge dies. Dummy shots are typically "partial shots," with all dies at least partly outside the resist EBR ring or even off the wafer, and therefore incapable of yielding. However, by exposing dummy shots, CMP processes see a more uniform pattern further out on the wafer, reducing the impact of CMP-induced wafer edge topography (which may be caused in part by a transition from patterned wafer surface to unpatterned wafer surface) on the actual yieldable edge dies. Subsequent layers will therefore see less wafer edge topography.

Exposing dummy shots tends to be fairly effective at improving edge die patterning on successive layers. On large-field masks, dummy shots can be placed adjacent to virtually all edge dies. On small field masks, however, limitations on the travel range of the exposure tool's stage mean that many edge dummy shots which might be desired simply cannot be exposed, because the proper image on the mask cannot be placed over top of the particular location on the wafer.

OBJECTS AND SUMMARY

An object of an embodiment of the present invention is to accurately print images in focus at the edge of a wafer so that edge die will yield.

Another object of an embodiment of the present invention is to accomplish this while using masks with small-field patterns.

Still another object of an embodiment of the present invention is to provide a method for printing edge dummy shots at arbitrary locations around the edge of the wafer while using small field masks.

Briefly, and in accordance with at least one of the foregoing objects, an embodiment of the present invention provides a method of printing an image on a wafer. The method includes the steps of printing a main image, wherein the main image includes fields which are fully on the wafer, and printing an alternate image, wherein the alternate image includes fields which are only partially on the wafer. The alternate image could be placed on a separate mask which is loaded onto the exposure tool after the mask with the main image has completed printing. Alternatively, it could be an extra image specially inserted on the mask with the main image for that layer.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
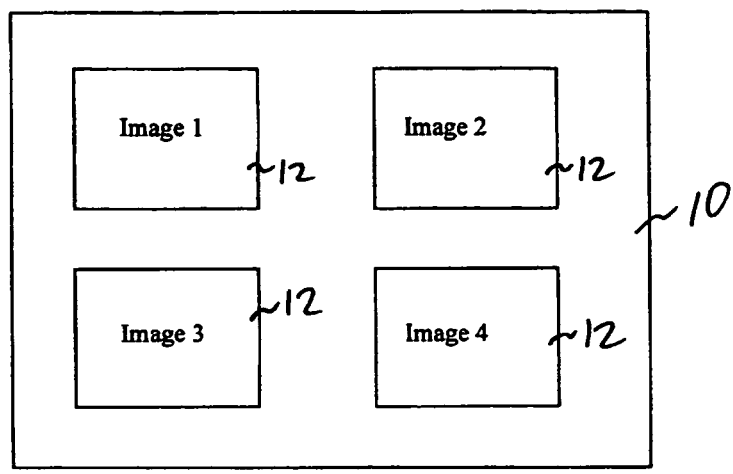
FIG. 1 is a simple diagram of a mask, illustrating four small fields on the mask.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

This invention is a method for printing edge dummy shots at arbitrary locations around the edge of the wafer while using small field masks, such as those used in LSI Logic's LVR scheme. Small fields can be advantageous because the mask patterns for multiple layers can then be placed on a single mask, substantially reducing the cost of manufacturing the masks for a particular device. An example of a mask (10) with 4 small fields (12) is shown in FIG. 1.

A disadvantage to using small fields is that a given small field can not necessarily be printed at any arbitrary location on a wafer. Exposure tools are generally designed to print full wafer coverage using a full field mask. However, achieving full wafer coverage with a small field typically requires more relative displacement between the wafer stage and the reticle stage than it does with a full field. Frequently exposure tools cannot achieve full wafer coverage with small fields due to stage travel limitations. This inability will be most apparent on edge dummy shots, which by their very nature fall at the outer extremes of the wafer perimeter.

Figure 2:
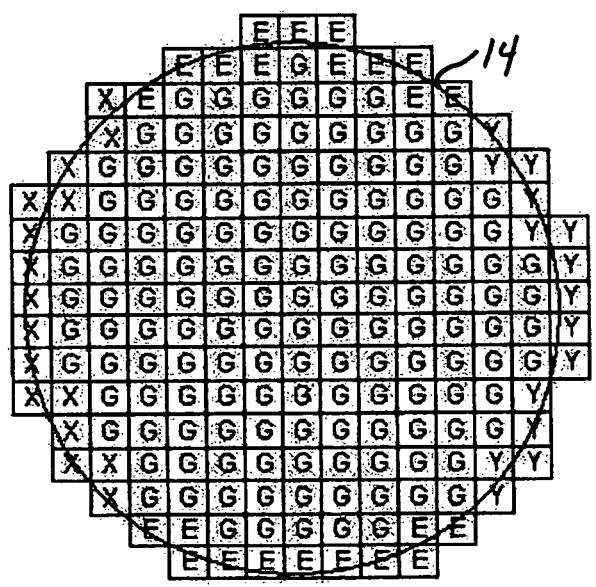
FIG. 2 is a wafer map, with the grid for a small field device shown, wherein fields which are completely on the wafer are marked with the letter "G", and fields which are partially off the wafer are marked with the letters "E", "X" or "Y"

An example of this limitation is shown in FIG. 2. This figure shows a wafer map (circle 14 represents the wafer), with the grid for a small field device shown. All fields marked as "G" are completely on the wafer, and may be expected to yield. All fields marked with "E", "X", or "Y" are partially off the wafer, and will therefore not yield. However, they are still worth printing as edge dummy shots in order to reduce CMP-induced topography variations within the good fields adjacent to them. Those fields marked with "E" are able to be printed with all images on the small field mask. The fields marked "X" (on the left side of the wafer) are not able to be printed with images 2 or 4 on the mask in FIG. 1 (located on the right side of the mask) due to stage travel limitations. Similarly, those fields marked with "Y" are not able to be printed with images 1 or 3 on the mask in FIG. 1. This provides a barrier to effectively using edge dummy shots to protect good fields near the wafer edge. Layer 1 (image 1) and layer 3 (image 3)

will not be able to protect the right edge of the wafer, while layer 2 (image 2) and layer 4 (image 4) will not be able to protect the left edge of the wafer.

Figure 3:
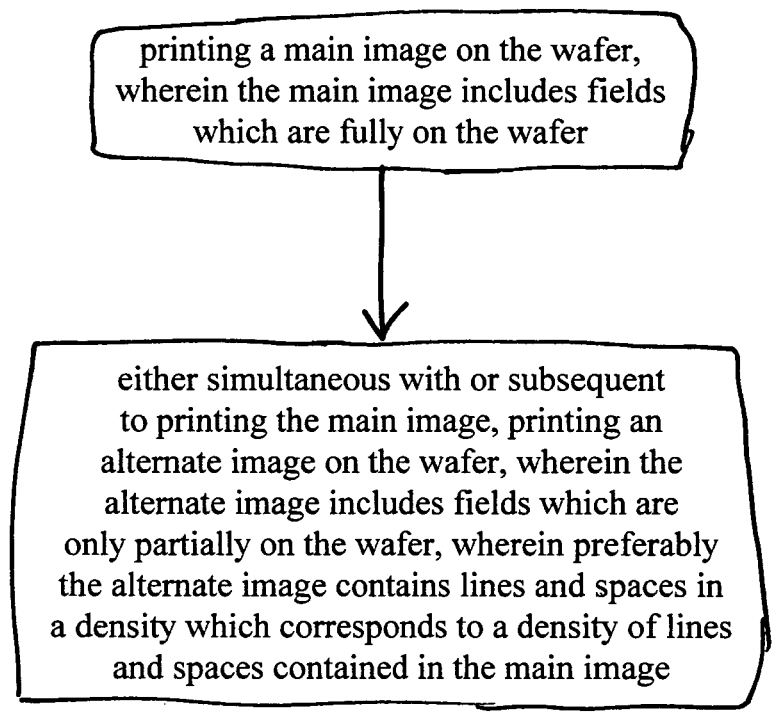
FIG. 3 is a flow chart which illustrates a method which is in accordance with an embodiment of the present invention.

This method provides a solution to this obstacle. It is to introduce an alternate image to use for dummy edge shots in those edge fields not reachable with the image being used for that particular layer. After the main image for the layer is printed in the good fields and the edge fields which are printable, the alternate image is then printed in the remaining edge fields (see FIG. 3). In this manner, the entire edge is printed and protected against CMP-induced topography variations.

The alternate image could be placed on a separate mask which is loaded onto the exposure tool after the mask with the main image has completed printing. Or it could be an extra image specially inserted on the mask with the main image for that layer. However, a particularly straightforward way to implement this methodology is to recognize that the edge dummy shots do not necessarily need to be exactly the same pattern as the main image printed in the good fields. As long as the edge dummy shots provide lines and spaces in a density similar to that of the main image for that layer, they will result in a more or less uniform CMP post-polish topography. Therefore, when printing layer 1 (image 1), either image 2 or image would be suitable for use as an image for edge dummy shots. Similarly, when printing layer 2 (image 2), either image 1 or image 3 would be suitable for use as an image for edge dummy shots. This strategy utilizes the images already existing on the small field mask to provide for dummy edge shots all the way around the wafer perimeter.

In any manner of implementation, the use of an alternate image for edge dummy shots will provide protection for the good fields near the wafer edge against the extreme topography that results from CMP near a transition from a patterned wafer to unpatterned wafer. It will therefore optimize the yield near the wafer edge even for devices using small field images, which would otherwise be unable to fully protect the wafer edge. This method will enable production strategies such as LSI Logic's LVR and RapidChip offerings, which are built around small field images to reduce mask expenses, to offer high yields as well as low tooling costs.

While embodiments of the present invention are shown and described, it is envisioned that those skilled in the art may devise various modifications of the present invention without departing from the spirit and scope of the appended claims.

What is claimed is:

1. A method for optimizing wafer edge patterning, said method comprising providing a mask, said mask useable to print on a wafer, said mask having a first image, a second image, a third image, and a fourth image, wherein the mask is configured for exposure such that the first image is useable in a photolithography process to print a first, main image on the wafer, wherein the mask is configured for exposure such that each of the second and fourth images is useable in a photolithography process to print edge dummy shots around an edge of the first, main image, wherein the mask is configured for exposure such that the third image is useable in a photolithography process to print a second, alternative image on the wafer, wherein the mask is configured for exposure such that each of the first and third images is useable in a photolithography process to print edge dummy shots around an edge of the second, alternative image.

* * * * *